US012609148B2

(12) United States Patent
Zhang

(10) Patent No.: US 12,609,148 B2
(45) Date of Patent: Apr. 21, 2026

(54) WRITE LEVELING CIRCUIT APPLIED TO MEMORY, METHOD FOR CONTROLLING WRITE LEVELING CIRCUIT AND MEMORY

(71) Applicant: CHANGXIN MEMORY TECHNOLOGIES, INC., Hefei City (CN)

(72) Inventor: Zhiqiang Zhang, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 228 days.

(21) Appl. No.: 18/513,533

(22) Filed: Nov. 18, 2023

(65) Prior Publication Data

US 2024/0087627 A1 Mar. 14, 2024

Related U.S. Application Data

(63) Continuation of application No. PCT/CN2022/132674, filed on Nov. 17, 2022.

(30) Foreign Application Priority Data

Aug. 16, 2022 (CN) .......................... 202210986112.3

(51) Int. Cl.
    *G11C 8/18* (2006.01)
    *G11C 7/10* (2006.01)
    *G11C 7/22* (2006.01)
(52) U.S. Cl.
    CPC .............. *G11C 8/18* (2013.01); *G11C 7/1093* (2013.01); *G11C 7/222* (2013.01)

(58) Field of Classification Search
    CPC .......... G11C 8/18; G11C 7/1093; G11C 7/222
    See application file for complete search history.

(56) References Cited

U.S. PATENT DOCUMENTS

| | | | |
|---|---|---|---|
| 8,386,737 B2 * | 2/2013 | Jeon | G06F 13/4243 |
| | | | 711/E12.001 |
| 10,839,876 B1 | 11/2020 | Ito | |
| 10,923,166 B2 * | 2/2021 | Park | G11C 7/1096 |

(Continued)

FOREIGN PATENT DOCUMENTS

| | | |
|---|---|---|
| CN | 112820333 A | 5/2021 |
| CN | 112863563 A | 5/2021 |
| CN | 114627918 A | 6/2022 |

OTHER PUBLICATIONS

International Search Report in the international application No. PCT/CN2022/132674, mailed on Mar. 2, 2023, 4 pages.

(Continued)

*Primary Examiner* — Vanthu T Nguyen

(57) ABSTRACT

A write leveling circuit applied to a memory includes a write signal generation unit and a sampling unit. The write signal generation unit is configured to receive a first clock signal and a first indication signal, and delay a first write signal according to the first clock signal, the first indication signal and a specified bit in the first indication signal, and output a second write signal. The sampling unit is connected to the write signal generation unit, and configured to receive a first data strobe signal and the second write signal, and output a second sampling signal according to received first Data Strobe Signal (DQS) and the second write signal.

19 Claims, 6 Drawing Sheets

(56) References Cited

U.S. PATENT DOCUMENTS

| | | |
|---|---|---|
| 11,276,442 B2 | 3/2022 | Ito |
| 11,456,031 B2 | 9/2022 | Chen |
| 2021/0141747 A1 | 5/2021 | Jeong |
| 2021/0151087 A1 | 5/2021 | Ito |
| 2022/0013156 A1 | 1/2022 | Penney |
| 2022/0180918 A1 | 6/2022 | Chen |

OTHER PUBLICATIONS

European patent office action in application No. 22955566.9, mailed on Apr. 7, 2025.
Kim Dongkyun et al: "A 1.1-V 10-nm Class 6.4-Gb/s/Pin 16-Gb DDR5 SDRAM With a Phase Rotator-ILO DLL, High-Speed SerDes, and DFE/FFE Equalization Scheme for Rx/Tx", IEEE Journal of Solid-State Circuits, IEEE, USA, vol. 55, No. 1, Jan. 1, 2020, pp. 167-177, xp011763169, ISSN: 0018-9200.
Kim Dongkyun et al: "23.2 A 1.1V 1ynm 6.4Gb/s/pin 16Gb DDR5 SDRAM with a Phase-Rotator-Based DLL, High-Sppeed SerDes and RX/TX Equalization Scheme", 2019 IEEE International Solid—State Circuits Conference—(ISSCC), IEEE, Feb. 17, 2019, pp. 380-382, xp033527832.

* cited by examiner

WRITE LEVELING CIRCUIT APPLIED TO MEMORY, METHOD FOR CONTROLLING WRITE LEVELING CIRCUIT AND MEMORY

CROSS-REFERENCE TO RELATED APPLICATIONS

This is a continuation of International Patent Application No. PCT/CN2022/132674 filed on Nov. 17, 2022, which claims priority to Chinese Patent application No. 202210986112.3 filed on Aug. 16, 2022. The disclosures of the above-referenced applications are hereby incorporated by reference in their entirety.

BACKGROUND

At present, a write leveling process is performed on data before the data is written into a memory. A Data Strobe Signal (DQS) received by the memory is regulated continuously, so that a time difference between an effective edge of the DQS received by the memory and an effective edge of a clock signal received by the memory meets specification requirements of the memory. A write leveling process of the memory may include external write leveling and internal write leveling. During the internal write leveling, a shortened Column Address Strobe Write Latency (CWL) is determined based on an original CWL of the memory and a shortened time of the CWL, and a write signal is delayed based on the shortened CWL.

However, since time specifications of the CWL and the shortened time of the CWL are inconsistent due to specification requirements of the memory in the above delay process, it is unable to directly determine an indication signal corresponding to the shortened CWL, and unable to achieve the above delay process.

Therefore, it is necessary to provide a write leveling circuit, to solve the above problem that it is unable to perform the delay process.

SUMMARY

The disclosure relates to the technical field of memories, and in particular to a write leveling circuit applied to a memory and a method for controlling the write leveling circuit and a memory, to solve the problem in some implementations that it is unable to achieve the internal write leveling due to inconsistent time specifications of the CWL of the memory and the shortened time of the CWL when the internal write leveling of the memory is performed.

A first aspect of the disclosure provides a write leveling circuit applied to a memory, the write leveling circuit includes a write signal generation unit and a sampling unit.

The write signal generation unit is configured to receive a first clock signal and a first indication signal, and delay a first write signal according to the first clock signal, the first indication signal and a specified bit in the first indication signal, and output a second write signal. The first indication signal is configured to indicate a shortened time of a Column Address Strobe Write Latency (CWL) of the memory and includes the specified bit, and a character of the specified bit is configured to indicate that the shortened time is an odd multiple of a clock cycle of the first clock signal or an even multiple of the clock cycle of the first clock signal.

The sampling unit is connected to the write signal generation unit, and configured to receive a first Data Strobe Signal (DQS) and the second write signal, and output a second sampling signal according to the first DQS and the second write signal.

A second aspect of the disclosure provides a method for controlling a write leveling circuit applied to a memory. The method is applied to the circuit as described in the first aspect, and includes the following operations.

The following step is repeated until it is determined based on the second sampling signal outputted by a sampling unit that an effective edge of a first DQS is aligned with an effective edge of a second write signal: regulating a delay time of the first DQS or the first indication signal, in response to the second sampling signal indicating that the effective edge of the first DQS is not aligned with the effective edge of the second write signal.

The delay time of the first DQS is extended by a preset period of time in response to the effective edge of the first DQS being aligned with the effective edge of the second write signal, and the delayed signal is determined as a DQS received when write operations are performed on the memory.

A third aspect of the disclosure provides a memory, including a write leveling circuit. The write leveling circuit includes a write signal generation unit and a sampling unit.

The write signal generation unit is configured to receive a first clock signal and a first indication signal, and delay a first write signal according to the first clock signal, the first indication signal and a specified bit in the first indication signal, and output a second write signal. The first indication signal is configured to indicate a shortened time of a Column Address Strobe Write Latency (CWL) of the memory and includes the specified bit, and a character of the specified bit is configured to indicate that the shortened time is an odd multiple of a clock cycle of the first clock signal or an even multiple of the clock cycle of the first clock signal.

The sampling unit is connected to the write signal generation unit, and configured to receive a first Data Strobe Signal (DQS) and the second write signal, and output a second sampling signal according to the first DQS and the second write signal.

Figure 1:
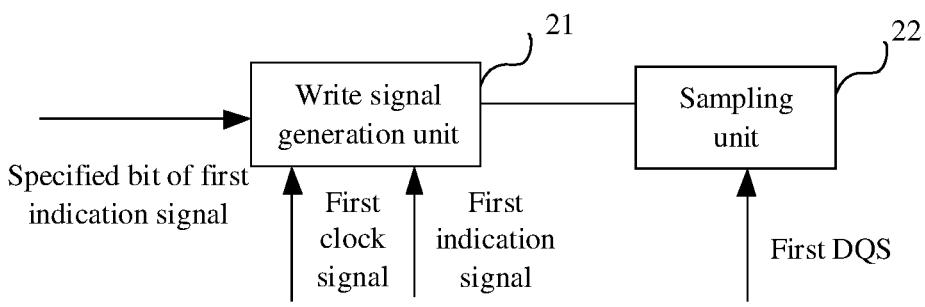
FIG. 1 is a schematic diagram of a circuit structure of a write leveling circuit applied to a memory according to an embodiment of the disclosure.

| Explanation of reference numerals: | | |
| --- | --- | --- |
| 21: Write signal generation unit; | 211: Preprocessing module | |
| 212: Determination module; | 2121: Processing submodule | |
| 2122: Shift register; | 2123: Compensator; | 21231: Delayer |
| 21232: First data selector; | 213: Decoder | |
| 214: Signal conversion module; | 22: Sampling unit; | 221: First trigger |
| 222: Second trigger; | 223: Second data selector; | 23: Delay unit |
| 24: First converter; | 25: Second converter. | |

DETAILED DESCRIPTION

Here, exemplary embodiments will be explained in detail, and examples of the exemplary embodiments are shown in the drawings. In the following descriptions related to the drawings, the same numeral in different drawings represents the same or similar elements, unless otherwise indicated. Implementations described in the following exemplary embodiments do not represent all implementations consistent with the disclosure. On the contrary, the implementations are only examples of devices and methods consistent with some aspects of the disclosure as detailed in the attached claims.

At present, a memory is usually provided in an electronic device for data storage. In order to reduce wiring between a Dynamic Random Access Memory (DRAM) in the electronic device and a controller of the memory, a fly-by bus topology structure is usually used when multiple DRAMs are included in the electronic device. That is, clock signal output ports in controllers corresponding to all the DRAMs are connected to the first DRAM of multiple DRAMs connected in series, to transmit a clock signal to the first DRAM. A clock signal received by each of remaining DRAMs in multiple DRAMs connected in series is a signal outputted by a previous DRAM connected in series with the DRAM. Furthermore, a Data Strobe Signal (DQS) end of each DRAM is directly connected to the controller, to receive a DQS transmitted by the controller, and wiring for transmitting the DQS between the DRAM and the controller has the same length for all DRAMs.

When the controller is connected to multiple DRAMs using the above bus topology structural, a time when the DQS reaches the DRAM is the same for all DRAMs, and a time difference of receiving the clock signals exists for different DRAMs, and the time difference between a time of receiving the clock signal by the DRAM and a time of receiving the DQS are different for different DRAMs. Therefore, a delay time of the DQS signal received by each DRAM is regulated continuously (that is, write leveling training of the memory is performed), so that a time difference between an effective edge of the DQS signal received on each DRAM and an effective edge of the clock signal meets specification requirements of the memory, to ensure that data can be written into the memory at a correct clock cycle.

A write leveling process of the memory may usually include two stages, one stage is an external write leveling stage, and the other stage is an internal write leveling stage. During the internal write leveling, a Column Address Strobe Write Latency (CWL) corresponding to a write signal may be continuously reduced, to reduce power consumption caused during transmission of the write signal inside the memory. Furthermore, the delay time of the DQS received by the memory may also be regulated. Through regulation for the delay time of the above signals, it is ensured that an effective edge of the write signal inside the memory is aligned with the effective edge of the DQS.

However, when a duration of the CWL corresponding to the write signal is shortened, time specifications of the CWL and the shortened time of the CWL are inconsistent in specification requirements of the memory. That is, in an actual specification definition of the memory, the CWL in specification requirements of the memory is an even multiple of a clock cycle of the clock signal, and the shortened time for storage of the CWL is an integer multiple (that is, an odd multiple or even multiple) of the clock cycle of the clock signal. Based on the above specification setting, when the shortened CWL is an odd multiple of the clock cycle, it is unable to determine a signal corresponding to the shortened CWL, and further unable to delay the write signal.

A write leveling circuit applied to a memory and a method for controlling the same provided in the disclosure aim to solve the above technical problems of some implementations.

Technical solutions of the disclosure and how the technical solutions of the disclosure solve the above technical problems are explained in detail below through specific embodiments. Several specific embodiments may be combined with each other below, and the same or similar concepts or processes may not be elaborated in some embodiments. The embodiments of the disclosure will be described below in combination with the drawings.

FIG. 1 is a schematic diagram of a circuit structure of a write leveling circuit applied to a memory according to an embodiment of the disclosure. As shown in FIG. 1, the write leveling circuit includes a write signal generation unit 21 and a sampling unit 22.

The write signal generation unit 21 is configured to receive a first clock signal and a first indication signal, and delay a first write signal according to the first clock signal, the first indication signal and a specified bit in the first indication signal, and output a second write signal. The first indication signal is configured to indicate a shortened time of a CWL of the memory and includes the specified bit. A character in the specified bit indicates that the shortened time is an odd multiple of a clock cycle of the first clock signal or an even multiple of the clock cycle of the first clock signal.

The sampling unit 22 is connected to the write signal generation unit 21, and configured to receive a first DQS and the second write signal, and output a second sampling signal according to the first DQS and the second write signal.

Exemplarily, in the embodiment, the write signal generation unit 21 included in the write leveling circuit is configured to receive the first clock signal transmitted to interior of the memory from a pin of the memory, and the first indication signal transmitted by a controller arranged outside the memory. The first indication signal transmitted by the controller is configured to indicate a shortened time of a CWL of a current memory to the write signal generation unit 21. Furthermore, the character in the specified bit of the first indication signal may also characterize that the shortened time of the CWL of the current memory is an odd multiple of the clock cycle of the first clock signal or an even multiple of the clock cycle of the first clock signal. The clock cycle of the first clock signal is a minimum cycle of a first clock cycle.

When the write signal generation unit 21 receives the first indication signal and the first clock signal, the write signal generation unit 21 may delay the first write signal, to obtain the second write signal.

Furthermore, the write leveling circuit further includes the sampling unit 22, and the sampling unit 22 is configured to receive the second write signal outputted by the write signal generation unit 21 connected thereto. The sampling unit 22 is further configured to receive the first DQS, and the first DQS may be a DQS received at a pin of the memory. Then, the sampling unit 22 generates the second sampling signal based on the received first DQS and the second write signal output by the write signal generation unit 21. The controller outside the memory may determine, based on the received second sampling signal, whether an effective edge of the first write signal is aligned with an effective edge of the first DQS in the memory. It should be noted that the effective edge of the signal mentioned in the disclosure may be a rising edge of the signal or a falling edge of the signal.

In some embodiments, the second sampling signal may be a difference between a time of the effective edge of the first write signal calculated by the write signal generation unit 21 and a time of the effective edge of the first DQS. Upon receiving the second sampling signal, the controller may determine, based on the second sampling signal, whether the effective edge of the first write signal is aligned with the effective edge of the first DQS.

In some embodiments, when the write signal generation unit 21 delays the first write signal based on the received first clock signal, the first indication signal and the specified bit of the first indication signal in the following manners. In response to the write signal generation unit 21 determining, based on the character in the specified bit of the first indication signal, that the shortened time indicated by the first indication signal is the even multiple of the clock cycle of the first clock signal, then at this point, a difference between the CWL of the memory and the shortened time of the CWL is an even multiple of the clock cycle of the first clock signal, and a signal corresponding to the difference may be determined. The write signal generation unit 21 may delay the first write signal based on the signal determined by the difference.

In response to the write signal generation unit 21 determining, based on the character in the specified bit of the first indication signal, that the shortened time indicated by the first indication signal is the odd multiple of the clock cycle of the first clock signal, and a difference between the CWL of the memory and the shortened time of the CWL being an odd multiple of the clock cycle of the first clock signal, a first time may be selected from shortened times defined in the memory specification. The first time is greater than the shortened time indicated by the first indication signal and is an even multiple of the clock cycle of the first clock signal. A difference between the first time and the CWL of the memory is an even multiple of the clock cycle, and the write signal generation unit 21 may perform a delay process based on a signal determined by the difference. Furthermore, since the first time is greater than the shortened time indicated by the first indication signal, a delay time of the first write signal is shortened. Therefore, after the delay process is performed based on the signal determined by the difference, the delayed first write signal is further delayed, and a time of the delay is a difference between the first time and the shortened time indicated by the first indication signal, so as to obtain the second write signal.

It should be noted that no specific limitations are made on the memory specification of the memory in the disclosure, and the memory may be a memory with Double Data Rate 5 (DDR5) memory specification or memories with other memory specifications.

It may be understood that in the embodiment, the write signal generation unit 21 of the write leveling circuit may determine that the shortened time corresponding to the first indication signal is the odd multiple or even multiple of the clock cycle of the first signal in advance through the specified bit of the first indication signal, and then delay the first write signal in combination with the shortened time corresponding to the first indication signal and the first clock signal. Therefore, the problem that it is unable to directly determine an indication signal corresponding to the shortened CWL and further unable to delay the write signal due to inconsistent time specifications of the CWL and the shortened time of the CWL in specification requirements of the memory can be solved.

In some embodiments, the second sampling signal characterizes whether an effective edge of the first DQS is aligned with an effective edge of the second write signal.

Exemplarily, external write leveling and internal write leveling are included in a process of performing write leveling on the memory. A main purpose of providing the internal write leveling further ensure whether the effective edge of the first DQS received within the memory is aligned with the effective edge of the second write signal while reducing transmission paths of the DQS within the memory.

During the internal write leveling, the sampling unit 22 outputs the second sampling signal directly based on the first DQS and the second write signal generated by the write signal generation unit 21 connected to the sampling unit 22. Whether the effective edge of the first DQS is aligned with the effective edge of the second write signal is determined through the second sampling signal. For example, the sampling unit 22 may determine whether the effective edge of the first DQS is aligned with the effective edge of the second write signal, by calculating a difference between a time corresponding to each effective edge of the first DQS and a time corresponding to each effective edge of the second write signal.

Figure 2:
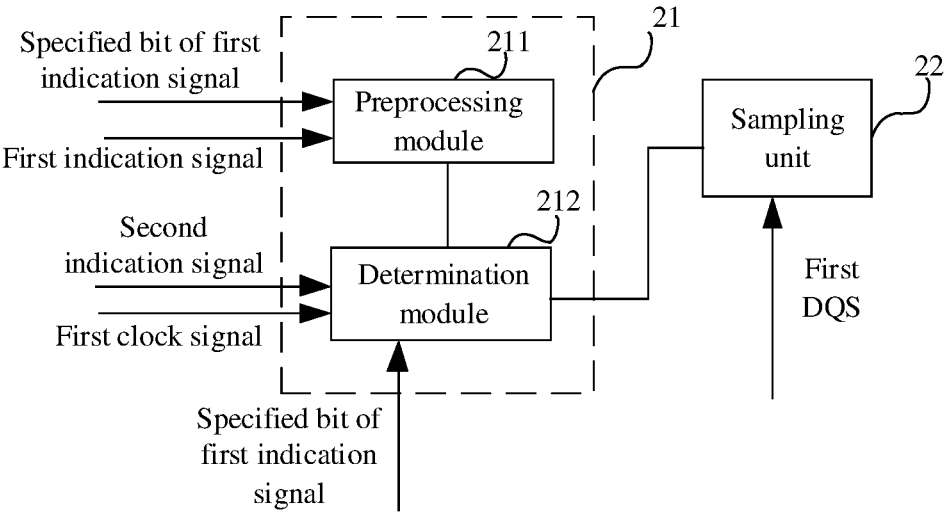
FIG. 2 is a schematic diagram of a circuit structure of a second write leveling circuit applied to a memory according to an embodiment of the disclosure.

In some embodiments, FIG. 2 is a schematic diagram of a circuit structure of a second write leveling circuit applied to a memory according to an embodiment of the disclosure. As shown in FIG. 2, based on the schematic structural diagram of the write leveling circuit shown in FIG. 1, the first indication signal in the embodiment includes at least one binary character, the specified bit is a lowest bit of the first indication signal, and the write signal generation unit 21 includes a preprocessing module 211 and a determination module 212.

The preprocessing module 211 is configured to sum the first indication signal and the character in the specified bit of the first indication signal, to obtain a preprocessed signal. The determination module 212 is connected to the preprocessing module 211, and configured to delay the first write signal based on the first clock signal, the preprocessed signal, a second indication signal and the specified bit of the first indication signal, and output the second write signal. The second indication signal is configured to indicate the CWL of the memory.

Exemplarily, in the embodiment, when the first indication signal is the binary character, the specified bit of the first indication signal may be the lowest bit of the first indication signal. For example, when the lowest bit of the first indication signal is 0, it may indicate that the shortened time indicated by the first indication signal is the even multiple of the clock cycle of the first clock signal. When the lowest bit of the first indication signal is 1, it may indicate that the shortened time indicated by the first indication signal is the odd multiple of the clock cycle of the first clock signal.

Furthermore, the write signal generation unit 21 in the embodiment includes a preprocessing module 211 and a determination module 212 connected to the preprocessing module 211. The preprocessing module 211 is configured to receive the first indication signal and the specified bit of the first indication signal, and sum the received first indication signal and the specified bit of the first indication signal, to obtain a preprocessed signal.

It may be understood that the lowest bit 0 of the first indication signal characterizes that the shortened time indicated by the first indication signal is the even multiple of the clock cycle of the first clock signal, and the lowest bit 1 of the first indication signal characterizes that the shortened time indicated by the first indication signal is the odd multiple of the clock cycle of the first clock signal. The lowest bit of the preprocessed signal obtained through the summation is 0 when the lowest bit of the first indication signal is 0. The lowest bit of the preprocessed signal obtained through the summation is also 0 when the lowest bit of the first indication signal is 1. That is, a shortened time indicated by the preprocessed signal obtained after summing the first indication signal and the lowest bit of the first indication signal is an even multiple of the clock cycle of the first clock signal. Furthermore, when the specification requirements of the memory provided with the above write leveling circuit specifies the larger the value of the preprocessed signal, the greater the shortened time corresponding to the preprocessed signal, the shortened time corresponding to the preprocessed signal obtained by the summation is greater than or equal to the shortened time corresponding to the first indication signal.

Furthermore, the determination module 212 provided in the write leveling circuit in the embodiment may be configured to receive a second indication signal transmitted by the controller outside the memory. The second indication signal is configured to indicate the CWL of the memory. In some embodiments, the CWL of the memory may be determined based on a required read and write rate of the memory. That is, when the read and write rate of the memory is required to be changed, the CWL indicated by the second indication signal transmitted to the memory may be regulated to ensure that the read and write rate of the memory meets required requirements.

When the determination module 212 receives the preprocessed signal outputted by the preprocessing module 211 connected to the determination module 212, the determination module 212 may delay the first write signal based on the received first clock signal, the preprocessed signal, the second indication signal and a specified bit of the first clock signal, to obtain the second write signal.

In some embodiments, when the determination module 212 delays the first write signal, the determination module 212 may first determine, based on the specified bit of the first indication signal, that the shortened time indicated by the first indication signal is the odd multiple of the clock cycle of the first clock signal, and the determination module 212 may request the preprocessing module 211 to forward the first indication signal currently received by the preprocessing module 211, and then determine a delay time based on the first indication signal and the preprocessed signal, and delay the received first write signal to obtain the delayed first write signal, and then delay the delayed first write signal based on the delay time indicated by the preprocessed signal to obtain the second write signal.

It may be understood that in the embodiment, the preprocessing module 211 in the write signal generation unit 21 sums the first indication signal and the character in the specified bit of the first indication signal, to obtain the preprocessed signal, so that time specification of the shortened time indicated by the preprocessed signal is consistent with time specification of the time of the CWL indicated by the second indication signal. For example, times indicated by the preprocessed signal and the second indication signal each is the even multiple of the clock cycle of the first clock signal, and the shortened CWL obtained after calculating a difference between the preprocessed signal and the second indication signal may also be within preset specification requirements of the memory, to prevent the problem that it is unable to obtain an indication signal in the preset specification of the memory corresponding to a time which corresponds to a difference between times indicated by the first indication signal and the second indication signal, due to inconsistency of the times indicated by the first indication signal and the second indication signal.

Figure 3:
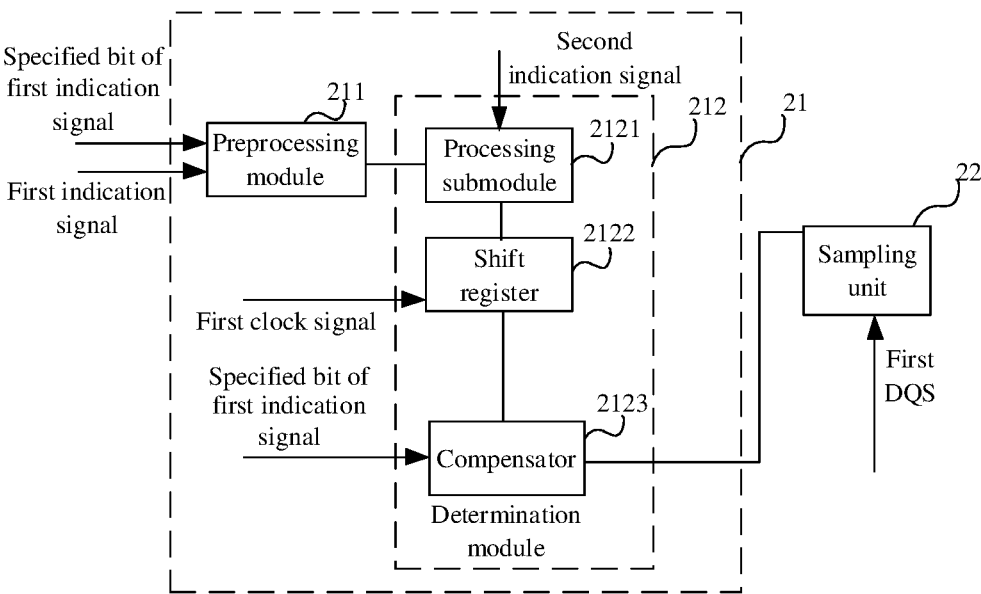
FIG. 3 is a schematic diagram of a circuit structure of a third write leveling circuit applied to a memory according to an embodiment of the disclosure.

FIG. 3 is a schematic diagram of a circuit structure of a third write leveling circuit applied to a memory according to an embodiment of the disclosure. As shown in FIG. 3, based on the structure of the device shown in FIG. 2, the determination module 212 provided in the embodiment includes a processing sub module 2121, a shift register 2122, and a compensator 2123.

The processing submodule 2121 is connected to the preprocessing module 211, and configured to determine a third indication signal based on the preprocessed signal and the second indication signal. The third indication signal indicates a delay time for the first write signal. The shift register 2122 is configured to delay the first write signal based on the third indication signal and the first clock signal, to obtain the third write signal. The compensator 2123 is connected to the shift register 2122, and is configured to compensate for a delay time of the third write signal based on the specified bit of the first indication signal and the first clock signal, to obtain the second write signal.

Exemplarily, the determination module 212 in the embodiment includes a processing submodule 2121, a shift register connected to the processing submodule 2121, and a compensator 2123 connected to the shift register 2122.

The processing submodule 2121 is configured to receive the preprocessed signal outputted by the preprocessing module 211 connected to the processing submodule 2121. Furthermore, the processing submodule 2121 is further configured to receive the second indication signal. It may be understood that the preprocessed signal may be taken as a shortened time for the CWL of the current memory, the second indication signal indicates the CWL of the memory, and time specification of the shortened time indicated by the preprocessed signal is consistent with time specification of the CWL of the memory indicated by the second indication signal. Therefore, the processing submodule 2121 may determine the third indication signal based on the second indication signal and the preprocessed signal, the third indication signal indicates a delay time currently required for the first write signal.

Then, after receiving the third indication signal, the shift register 2122 in the write leveling circuit may shift the first write signal based on the third indication signal and the first clock signal. That is, the shift register delays the first write signal, to obtain the third write signal.

Furthermore, the compensator 2123 is also provided in the write leveling circuit. It may be understood that the shortened time indicated by the preprocessed signal is greater than or equal to the shortened time indicated by the first indication signal received by the preprocessing module 211 in the memory, a delay time of the third write signal relative to the first write signal is less than an original delay time when the shortened time indicated by the preprocessed signal is greater than the shortened time indicated by the first indication signal. The original delay time is a difference between the CWL of the memory and the shortened time indicated by the first indication signal. Therefore, the compensator 2123 may also compensate for the third write signal, so that a delay time between the obtained second write signal and the first write signal is equal to the original delay time.

In some embodiments, the compensator 2123 may determine, based on the character corresponding to the specified bit of the first indication signal, whether the preprocessed signal outputted by preprocessing module 211 is the same as the first indication signal. When the compensator 2123 determines that the first indication signal is different from the preprocessed signal, compensation is required. When compensator 2123 determines that the first indication signal is the same as the preprocessed signal, the third write signal may be directly taken as the second write signal finally outputted by the write signal generation unit 21.

It should be noted that in some embodiments, the compensator 2123 in the determination module 212 may also be arranged prior to the processing submodule 2121. That is, the compensator 2123 is connected to the processing submodule 2121 and the shift register 2122 respectively, and the processing submodule 2121 is connected to the shift register 2122. The compensator 2123 compensates for a delay time of the first write signal based on the specified bit of the first indication signal, and outputs the signal obtained by compensation to the shift register 2122 connected to the compensator 2123. The shift register 2122 may delay the signal obtained by the compensation based on the third indication signal outputted by the processing submodule 2121 connected thereto, to obtain the second write signal.

It may be understood that in the embodiment, the processing submodule 2121 may be provided in the determination module 212 to process the second indication signal and the preprocessed signal transmitted by the preprocessing module 211 to the processing submodule 2121, so as to obtain the third indication signal. The shift register 2122 connected to the processing submodule 2121 may delay the first write signal based on the third indication signal transmitted by the processing submodule 2121, to obtain the third write signal. Then, the compensator 2123 in the determination module 212 may also compensate for the third write signal based on the specified bit of the first indication signal, to obtain the second write signal. With the above method, it may ensure that the delay time of the finally obtained second write signal relative to the first write signal conforms to a time difference corresponding to the first indication signal and the second indication signal, and may further ensure accuracy of the write leveling process of the memory.

In some embodiments, in the write leveling circuit shown in FIG. 3, the processing submodule 2121 in the write leveling circuit is configured to determine, as a first delay time corresponding to the preprocessed signal, the shortened time of the CWL of the memory corresponding to the first indication signal in a first mapping relationship which is the same as the preprocessed signal based on the preprocessed signal and the first mapping relationship. The first delay time characterizes a shortened time currently required for the CWL of the memory, and the first mapping relationship indicates multiple first indication signals of the memory, and shortened times of the CWL of the memory having one-to-one correspondences with the multiple first indication signals.

The processing submodule 2121 is configured to determine a CWL corresponding to the second indication signal based on the second indication signal and a second mapping relationship. The second mapping relationship indicates multiple second indication signals of the memory, and CWLs having one-to-one correspondences with the second indication signals.

The processing submodule 2121 is configured to calculate a difference between the first delay time corresponding to the preprocessed signal and the CWL corresponding to the second indication signal, to obtain a second delay time, and determine an indication signal corresponding to the second delay time as the third indication signal based on the second delay time and the second mapping relationship.

Exemplarily, in the embodiment, a first register and a second register may be provided in the memory. The first register may be configured to store the first indication signal, and the second register may be configured to store the second indication signal.

For example, when the memory is provided with a high-order DQS receiving pin and a low-order DQS receiving pin, a write leveling process is performed on signals received by the high-order DQS receiving pin and the low-order DQS receiving pin of the memory respectively. When the number of bits in the first register is 8, lower four bits of the first register may be configured to store the first indication signal received when write leveling is performed on a low-order DQS, and upper four bits of the first register may be configured to store the first indication signal received when write leveling is performed on a high-order DQS. Furthermore, the second register may be configured to store the received second indication signal.

The first mapping relationship in the embodiment may be configured to represent the shortened time of the CWL of the memory corresponding to the first indication signal in the first register. For example, when the first indication signal in the first register is 0000, it may be determined, based on the first mapping relationship, that shortened data of the CWL of the memory corresponding to the first indication signal is 0 tck. The tck characterizes the clock cycle of the first clock signal. That is, the first mapping relationship may be configured to indicate multiple first indication signals, as well as the shortened time of the CWL corresponding to each of the multiple first indication signals.

The second mapping relationship in the embodiment indicates the CWL corresponding to the second indication signal in the second register. For example, when the second indication signal is 00000, it may be determined, based on the second mapping relationship, that the CWL corresponding to 00000 is 22 tck. That is, the second mapping relationship indicates multiple second indication signals of the memory, and CWLs having one-to-one correspondences with the second indication signals. The second indication signal indicates the CWL of the memory. That is, the first mapping relationship indicates correspondences between the first indication signals and the shortened times of the CWL, and the second mapping relationship indicates correspondences between the second indication signals and the CWLs. Upon receiving the preprocessed signal and the second indication signal, the processing submodule 2121 may search the first mapping relationship for the shortened time of the CWL of the memory corresponding to the first indication signal which is the same as the received preprocessed signal, and take the shortened time of the CWL as the first delay time corresponding to the preprocessed signal. The first delay time may be seen as the shortened time currently required for the CWL of the memory. The processing submodule 2121 may also search the second mapping relationship for the CWL corresponding to the received second indication signal. Then, the processing submodule 2121 calculates a difference between the CWL and the first delay time, to obtain the second delay time. The processing submodule 2121 may also search, based on the second mapping relationship, for the indication signal corresponding to the second delay time, and take the indication signal as the third indication signal.

It may be understood that when the shift register 2122 delays the first write signal based on the first mapping relationship and the received third indication signal, manner in the embodiment that the processing submodule 2121 determines the third indication signal, may ensure that the shift register 2122 may accurately recognize the delay time corresponding to the third indication signal, and achieve delay of the first write signal, and may further ensure accuracy of the write leveling process of the memory.

In some embodiments, based on the structure of the write leveling circuit shown in FIG. 3, the compensator 2123 in the embodiment is configured to: take the third write signal as the second write signal, in response to the character in the specified bit of the first indication signal characterizing that the shortened time is the even multiple of the clock cycle of the first clock signal; delay the third write signal in response to the character in the specified bit of the first indication signal characterizing that the shortened time is the odd multiple of the clock cycle of the first clock signal, to obtain the second write signal. A duration of the delay is a difference between the first delay time corresponding to the preprocessed signal and the shortened time of the CWL of the memory indicated by the first indication signal.

Exemplarily, in the embodiment, when the CWL is the even multiple of the clock cycle of the clock signal in specification requirements of the memory, and the shortened time of the CWL is an integer multiple of the clock cycle of the clock signal, and when the character in the specified bit of the first indication signal characterizes that the shortened time is the even multiple of the clock cycle of the first clock signal, the preprocessed signal obtained when the preprocessing module 211 sums the first indication signal and the specified bit of the first indication signal is the same as the first indication signal, the compensator 2123 directly outputs the third write signal outputted by the shift register 2122 connected thereto as the second write signal.

When the character in the specified bit of the first indication signal characterizes that the shortened time is the odd multiple of the clock cycle of the first clock signal, the shortened time indicated by the preprocessed signal obtained when the preprocessing module 211 sums the first indication signal and the specified bit of the first indication signal is the even multiple of the clock cycle of the first clock signal. Since the currently required shortened time indicated by the preprocessed signal obtained after the summation is greater than the shortened time indicated by the first indication signal, the compensator 2123 may also delay the third write signal outputted by the shift register 2122 connected thereto, and output the delayed signal as the second write signal. It may be understood that in order to ensure that the delay time of the second write signal relative to the first write signal conforms to the difference between times indicated by the first indication signal and the second indication signal respectively, a duration of the delay performed on the third write signal by the compensator 2123 is the difference between the first delay time indicated by the preprocessed signal and the shortened time indicated by the first indication signal.

For example, as shown in the following tables, Table 1 and Table 2 are schematic tables of the first mapping relationship and the second mapping relationship provided in the embodiment of the disclosure respectively.

TABLE 1

| Schematic table of the first mapping relationship provided in the embodiment of the disclosure | |
| --- | --- |
| First indication signal | Shortened time of CWL |
| 0000 | 0 tck |
| 0001 | 1 tck |
| 0010 | 2 tck |
| . . . | . . . |
| 1111 | 15 tck |

TABLE 2

| Schematic table of the second mapping relationship provided in the embodiment of the disclosure | |
| --- | --- |
| Second indication signal | CWL |
| 00000 | 22 tck |
| 00001 | 24 tck |
| . . . | . . . |
| 10101 | 64 tck |
| 10110 | 66 tck |

It may be seen from Table 2 that each value of the CWL is the even multiple of the clock cycle of the first clock signal. It may be seen from Table 1 that the shortened time (i.e. the characterized first delay time) corresponding to the first indication signal is an integer multiple of the clock cycle of the first clock signal. Furthermore, it may be seen from Table 1 that when the first indication signal is in a binary counting manner, the corresponding CWL is an even multiple of the first clock signal in response to the character in the lowest bit of the first indication signal being 0. The corresponding CWL is an odd multiple of the first clock signal in response to the character in the lowest bit of the first indication signal being 1. It should be noted that tck in the Table characterizes the clock cycle of the first clock signal. That is, 22 tcks in the Table characterizes that the CWL of the memory is 22 times the clock cycle of the first clock signal.

When the first indication signal received by the preprocessing module 211 is 0001, the preprocessing module 211 may sum the first indication signal 0001 and the lowest bit 1 of the first indication signal, to obtain the preprocessed signal 0010. When the processing submodule 2121 receives the preprocessed signal 0010 transmitted by the preprocessing module 211 connected thereto and the second indication signal 00001, the processing submodule 2121 may calculate a difference between the first delay time 2 tcks corresponding to the preprocessed signal 0010 and the CWL 24 tcks corresponding to the second indication signal 00001, to obtain 22 tck. Furthermore, the processing submodule 2121 may determine the second indication signal 00000 corresponding to 22 tcks based on the second mapping relationship and the calculated difference 22 tcks, and transmit the second indication signal as the third indication signal to the shift register 2122 connected to the processing submodule 2121. The shift register 2122 delays the first write signal based on the received third indication signal and the first clock signal for 22 tck, to obtain the third write signal, and outputs the third write signal to the compensator 2123 connected to shift register 2122. After receiving the specified bit 1 of the first indication signal, the compensator 2123 may determine that the delay time between the currently obtained third write signal and the first write signal is shortened. Since it is determined from the first mapping table that the preprocessed signal obtained by summing the first indication signal and the lowest bit 1 of the first indication signal is a next first indication signal adjacent to the first indication signal in the first mapping relationship, and a difference between shortened times corresponding to adjacent first indication signals is 1 tck, the compensator 2123 may continue delaying the received third write signal for 1 tck, to obtain the second write signal. The delay time of the second write signal relative to the first write signal is 23 tcks, which is equal to the difference between the CWL 24 tcks corresponding to the second indication signal 00001 and the shortened time 1 tck corresponding to the first indication signal 0001.

Upon receiving the first indication signal 0010, the preprocessing module 211 may sum the first indication signal 0010 and the lowest bit 0 of the first indication signal, to obtain the preprocessed signal 0010 (the first indication signal is the same as the preprocessed signal). Upon receiving the preprocessed signal 0010 transmitted by the preprocessing module 211 connected thereto and the second indication signal 00001, the processing submodule 2121 may calculate a difference between the first delay time 2 tcks corresponding to the preprocessed signal 0010 and the CWL 24 tcks corresponding to the second indication signal 00001, to obtain 22 tcks. Furthermore, the processing submodule 2121 may determine that the second indication signal corresponding to 22 tcks is 00000 based on the second mapping relationship and the calculated difference 22 tcks, and transmit the second indication signal as the third indication signal to the shift register 2122 connected to the processing submodule 2121. The shift register 2122 delays the first write signal based on the received third indication signal and the first clock signal, for 22 tcks, to obtain the third write signal, and outputs the third write signal to the compensator 2123 connected to shift register 2122. After receiving the specified bit 0 of the first indication signal, the compensator 2123 may determine that the delay time of the currently obtained third write signal relative to the first write signal is not shortened, and may directly output the third write signal as the second write signal to the sampling unit 22.

Figure 4:
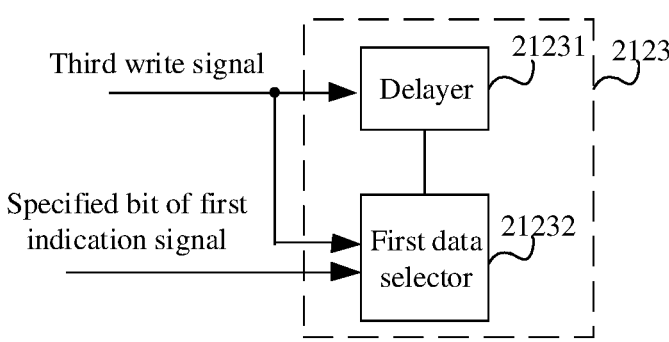
FIG. 4 is a schematic diagram of a circuit structure of a compensator according to an embodiment of the disclosure.

In some embodiments, FIG. 4 is a schematic diagram of a circuit structure of a compensator 2123 according to an embodiment of the disclosure. As shown in FIG. 4, the compensator 2123 includes a delayer 21231 and a first data selector 21232.

The delayer 21231 is connected to the shift register 2122, and configured to delay the third write signal outputted by the shift register 2122, to obtain a delayed third write signal.

The first data selector 21232 is connected to the delayer 21231, and configured to receive the delayed third write signal outputted by the delayer 21231 and the third write signal outputted by the shift register 2122. The first data selector 21232 is further configured to receive the specified bit of the first indication signal, and output the third write signal as the second write signal in response to the character in the specified bit of the first indication signal characterizing the even multiple of the clock cycle of the first clock signal. The first data selector 21232 is configured to output the delayed third write signal as the second write signal, in response to the character in the specified bit of the first indication signal characterizing the odd multiple of the clock cycle of the first clock signal.

Exemplarily, in the embodiment, the compensator 2123 includes a delayer 21231 and a first data selector 21232. The delayer 21231 is connected to the shift register 2122 in the determination module 212, and configured to receive the third write signal outputted by the shift register 2122, and delay the received third write signal to obtain the delayed third write signal, and output the delayed third write signal to the first data selector 21232 connected to the delayer 21231. Furthermore, the first data selector 21232 is also connected to the shift register 2122 in the determination module 212, and configured to receive the third write signal outputted by the shift register 2122. Furthermore, the first data selector 21232 is further configured to receive the character in the specified bit of the first indication signal, and select a current to-be-output signal from the delayed third write signal and the third write signal based on the character in the specified bit of the first indication signal.

Furthermore, when the first data selector 21232 determines that the character in the specified bit of the first indication signal characterizes the even multiple of the clock cycle of the first clock signal, the first data selector 21232 outputs the third write signal as the second write signal. When the first data selector 21232 determines that the character in the specified bit of the first indication signal characterizes the odd multiple of the clock cycle of the first clock signal, the first data selector 21232 outputs the delayed third write signal as the second write signal.

It may be understood that in the embodiment, the outputted second write signal is determined by providing the delayer 21231 and the first data selector 21232, which makes the circuit structure relatively simple and easy to be implemented.

Figure 5:
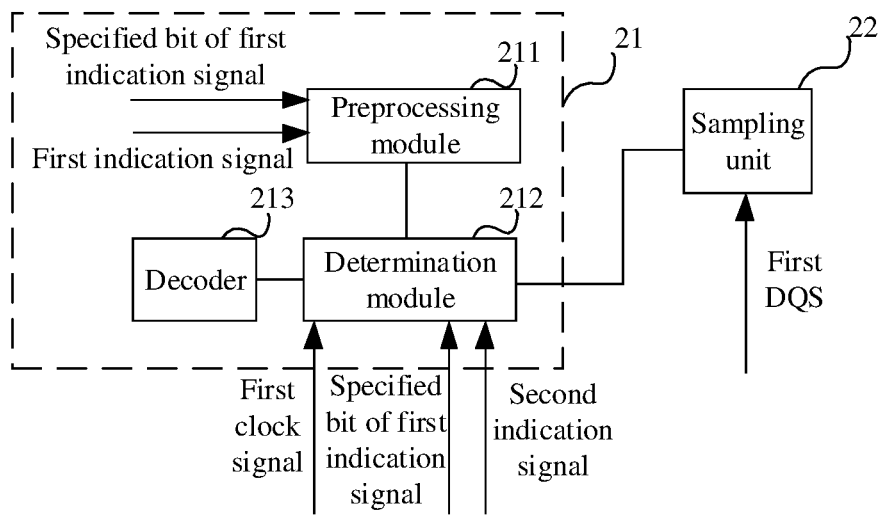
FIG. 5 is a schematic diagram of a circuit structure of a fourth write leveling circuit applied to a memory according to an embodiment of the disclosure.

FIG. 5 is a schematic diagram of a circuit structure of a fourth write leveling circuit applied to a memory according to an embodiment of the disclosure. Based on the structure shown in FIG. 2, the write signal generation unit 21 in the embodiment further includes a decoder 213. The decoder 213 is connected to the determination module 212, and configured to decode received write instructions, and output the first write signal.

Exemplarily, as shown in FIG. 5, a write signal generation circuit in the embodiment includes a decoder 213, a preprocessing module 211, and a determination module 212. The write instructions received by the decoder 213 may be write instructions transmitted by a controller outside the memory including the write signal generation circuit, that is, write instructions transmitted by the controller to pins of the memory. The write instructions indicate that write operations are to be performed on the memory at present.

The decoder 213 in the write signal generation circuit may decode the write instructions after receiving the write instructions, to obtain the first write signal which may be recognized by a device inside the memory and characterizes that write operations are to be performed at present. Then, the decoder 213 transmits the obtained first write signal to the determination module 212 connected to the decoder 213, and the determination module 212 delays the received first write signal based on the preprocessed signal generated by the preprocessing module 211 connected thereto, the first clock signal, the specified bit of the first indication signal and the second indication signal, to obtain the second write signal, and outputs the second write signal to the sampling unit 22 connected to the determination module 212.

It may be understood that in the embodiment, the decoder 213 is provided in the write signal generation unit 21, and the write instructions received by the decoder 213 is decoded, and the device in the memory may accurately determine that write operations are to be performed on the memory at present. Furthermore, when signals are regulated subsequently based on the write leveling circuit, the controller may determine accurately the DQS required for the memory, thereby improving accuracy of writing data into the memory.

Figure 6:
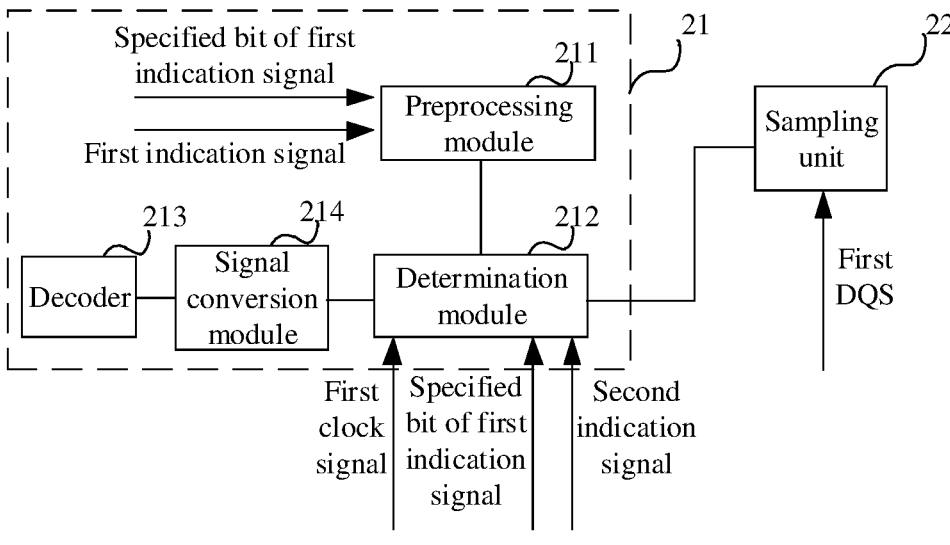
FIG. 6 is a schematic diagram of a circuit structure of a fifth write leveling circuit applied to a memory according to an embodiment of the disclosure.

FIG. 6 is a schematic diagram of a circuit structure of a fifth write leveling circuit applied to a memory according to an embodiment of the disclosure. Based on the structure shown in FIG. 5, the write signal generation unit 21 in the embodiment further includes a signal conversion module 214 through which the decoder 213 is connected to the write signal generation unit 21. The signal conversion module 214 is configured to perform pulse broadening on the first write signal outputted by the decoder 213 to obtain a broadened write signal, and output the broadened write signal as the first write signal to the determination module 212.

Exemplarily, the write signal generation unit 21 in the write leveling circuit in the embodiment includes a decoder 213, a signal conversion module 214, and a determination module 212. The decoder 213 is configured to receive write instructions, decode the write instructions, and transmit the decoded signal to the signal conversion module 214 connected to the decoder 213. Then, the signal conversion module 214 performs pulse broadening on the decoded signal outputted by the decoder 213, and outputs the broadened signal as the first write signal to the determination module 212 connected thereto. The determination module 212 may delay the received first write signal to obtain second write signal, and output the second write signal to the sampling unit 22 connected to the determination module 212.

It may be understood that, the signal conversion module 214 in the write signal generation unit 21 in the embodiment performs the pulse broadening on the signal outputted by the decoder 213 to the signal conversion module 214, to meet specification requirements corresponding to the memory (such as Standard Performance Evaluation Corporation (SPEC) requirements).

Based on any one of the above embodiments, a second trigger 222 is provided in the sampling unit 22. The second trigger 222 has a data end which is connected to the write signal generation unit 21 and configured to receive the second write signal outputted by the write signal generation unit 21, and a clock end which is configured to receive the first DQS. The second trigger 222 is configured to output the second sampling signal based on the second write signal and the first DQS.

Exemplarily, in the embodiment, the clock end of the second trigger 222 is configured to receive the first DQS, the data end of the second trigger 222 is connected to the write signal generation unit 21 and configured to receive the second write signal outputted by the write signal generation unit 21. Then, the second trigger 222 samples the second write signal received by the second trigger 222 based on an effective edge of the received first DQS to obtain a sampling result, and takes the sampling result as the second sampling signal.

It may be understood that the second trigger 222 is provided in the embodiment, to compare whether the effective edge of the second write signal is aligned with the effective edge of the first DQS, which is easy to be implemented and prevents a complex process of calculating a time difference between effective edges of the two signals.

Based on any one of the above embodiments, the write leveling circuit provided in the embodiment further includes a delay unit 23 configured to delay the received first DQS and output a second DQS. The sampling unit 22 is connected to the delay unit 23, and is configured to receive the second DQS outputted by the delay unit 23 and output a first sampling signal according to the second DQS and the second write signal. The first sampling signal characterizes whether an effective edge of the first clock signal is aligned with an effective edge of the first DQS.

Exemplarily, in order to implement an external write leveling process in the write leveling training of the memory, the external write leveling is configured to align the effective edge of the DQS received at the pin of the memory with the effective edge of the clock signal. A delay unit 23 is also provided in the write leveling circuit in the embodiment. The delay unit 23 may be configured to delay the received first DQS, to obtain the second DQS, and transmit the second DQS to the sampling unit 22 connected to the delay unit 23. When the write leveling circuit is arranged inside the memory, the first DQS received by the delay unit 23 may be a DQS transmitted inside the memory, which may be obtained by converting the DQS received at the pin of the memory.

Furthermore, the sampling unit 22 in the embodiment is further configured to generate the first sampling signal based on the second write signal outputted by the write signal generation unit 21 connected thereto and the second DQS outputted by the delay unit 23 connected thereto. Therefore, the controller outside the memory may regulate signals transmitted by the controller to the memory based on the received first sampling signal, thereby ensuring that the time difference between the effective edge of the DQS signal received at the pin of the memory and the effective edge of the clock signal meets a time difference range specified by the memory.

It should be noted that in the embodiment, a delay time for which the delay unit 23 delays the first DQS is equivalent to a delay time for which the write signal generation unit 21 delays the first write signal upon receiving the first clock signal to obtain the second write signal, and the sampling unit 22 may compare whether an effective edge of the second DQS is aligned with the effective edge of the second write signal, to determine whether the effective edge of the first DQS is aligned with the effective edge of the first clock signal.

It may be understood that by providing the delay time of the delay unit 23 as above, the controller outside the memory may determine whether a purpose of the external write leveling of the memory is achieved based on the first sampling signal outputted by the sampling unit 22.

Figure 7:
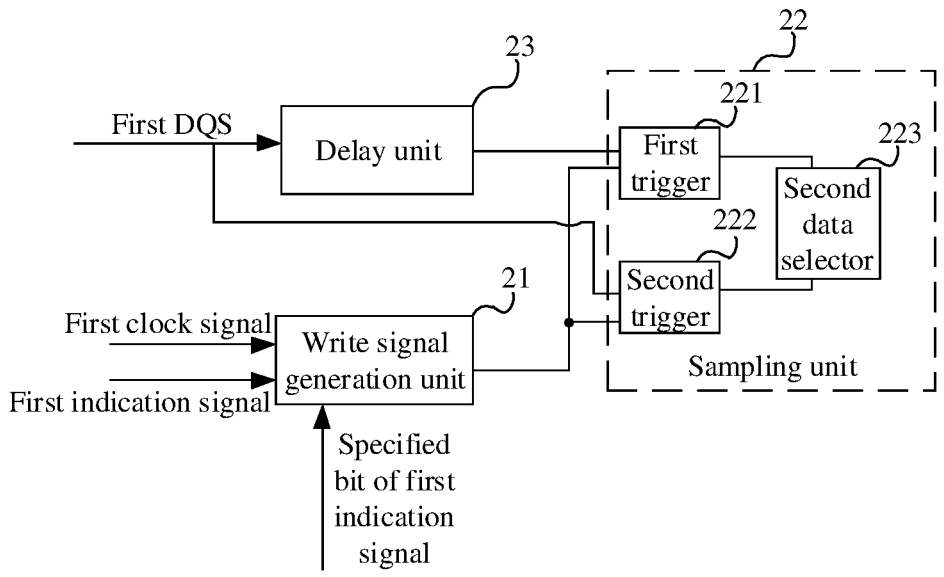
FIG. 7 is a schematic diagram of a circuit structure of a sixth write leveling circuit applied to a memory according to an embodiment of the disclosure.

Based on the above embodiments, FIG. 7 is a schematic diagram of a circuit structure of a sixth write leveling circuit applied to a memory according to an embodiment of the disclosure. As shown in FIG. 7, based on the structure of the write leveling circuit shown in FIG. 1, the write leveling circuit in the embodiment includes a delay unit 23, a write signal generation unit 21, and a sampling unit 22. The sampling unit 22 includes a first trigger 221, a second trigger 222, and a second data selector 223. The first trigger 221 has a data end which is connected to the write signal generation unit 21 and configured to receive the second write signal outputted by the write signal generation unit 21, and a clock end which is connected to an output end of the delay unit 23 and configured to receive the second DQS outputted by the delay unit 23. The first trigger 221 is configured to output the first sampling signal based on the second write signal and the second DQS. The second trigger 222 has a data end which is connected to the write signal generation unit 21 and configured to receive the second write signal outputted by the write signal generation unit 21, and a clock end which is configured to receive the first DQS. The second trigger 222 is configured to output the second sampling signal based on the second write signal and the first DQS. The second data selector 223 has a first end connected to an output end of the first trigger 221, and a second end connected to an output end of the second trigger 222.

Exemplarily, as shown in FIG. 7, the write leveling circuit in the embodiment includes a delay unit 23, a write signal generation unit 21, and a sampling unit 22, and the sampling unit 22 is further provided with a first trigger 221, a second trigger 222, and a second data selector 223. The clock end and the data end of the first trigger 221 are connected to the delay unit 23 and the write signal generation unit 21 respectively. The first trigger 221 samples the second write signal received by the data end of the first trigger 221 and outputted by the write signal generation unit 21 connected thereto, based on the effective edge of the clock signal received by the clock end of the first trigger 221 and transmitted by the delay unit 23 connected thereto, to obtain a sampling result as the first sampling signal. The first trigger outputs the first sampling signal to the second data selector 223 connected to the first trigger 221.

Furthermore, the clock end of the second trigger 222 is configured to receive the first DQS, and the data end of the second trigger 222 is connected to the write signal generation unit 21 and configured to receive the second write signal outputted by the write signal generation unit 21. Then, the second trigger 222 samples the second write signal received by the second trigger 222 based on the effective edge of the received first DQS, to obtain a sampling result as the second sampling signal. The second trigger 222 outputs the second sampling result to the second data selector 223 connected to the second trigger 222.

After receiving the first sampling signal transmitted by the first trigger 221 connected to the second data selector 223 and the second sampling signal transmitted by the second trigger 222 connected to the second data selector 223, the second data selector 223 may select one of the sampling signals to be output. Therefore, the controller outside the memory may regulate signals transmitted by the controller to the memory based on the received first sampling signal or second sampling signal.

It may be understood that in the embodiment, compared to simultaneous transmission of the first sampling signal and the second sampling signal to the controller, the sampling unit 22 in which the first trigger 221, the second trigger 222 and the second data selector 223 are provided in the embodiment may reduce occupation of data receiving ports on the controller, and occupation of pins on the memory may also be reduced when the write leveling circuit is encapsulated in the memory.

Figure 8:
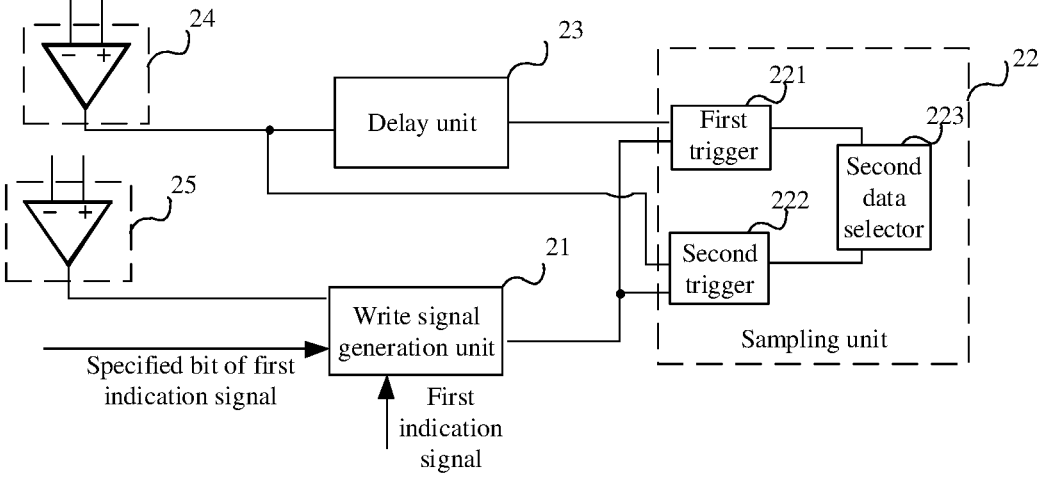
FIG. 8 is a schematic diagram of a circuit structure of a seventh write leveling circuit applied to a memory according to an embodiment of the disclosure.

Based on the above embodiments, FIG. 8 is a schematic diagram of a circuit structure of a seventh write leveling circuit applied to a memory according to an embodiment of the disclosure. As shown in FIG. 8, based on the structure of the write leveling circuit shown in FIG. 7, the write leveling circuit provided in the embodiment further includes a first converter 24 and a second converter 25. The first converter 24 is connected to the delay unit 23 and the sampling unit 23, and configured to perform logical level conversion on a received third DQS, to obtain the first DQS. A level of the third DQS is a Current Model Logic (CML) level, and a level of the first DQS is a Complementary Metal Oxide Semiconductor (CMOS) level. The second converter 25 is connected to the write signal generation unit 21, and configured to perform logical level conversion on a received second clock signal, to obtain the first clock signal. A level of the second clock signal is a CML level, and a level of the first clock signal is a CMOS level.

Exemplarily, based on the structure of the write leveling circuit shown in FIG. 7, a first converter 24 is further included in the embodiment. In a practical application, the third DQS received by the first converter 24 may be a DQS transmitted by the controller outside the memory to the pin of the memory. When the controller transmits the third DQS to the memory, a CML level transmission manner is usually used to improve signal transmission efficiency. Furthermore, a CMOS level transmission manner is usually used inside the memory for signal transmission. Therefore, after obtaining the third DQS at the pin, the first converter 24 in the write leveling circuit may convert the third DQS transmitted in the CML level transmission manner into the first DQS transmitted in the CMOS level transmission manner, and then transmit the first DQS to the delay unit 23 connected to the first converter 24 and the second trigger 222 in the sampling unit 22 respectively. Each device in the write leveling circuit in the memory may recognize the first DQS accurately.

Furthermore, a second converter 25 is further included in the write leveling circuit. In a practical application, the second clock signal received by the second converter 25 may be a clock signal transmitted by the controller outside the memory or a previous memory connected in series with the memory to the pin of the memory. When the controller transmits the clock signal to the memory or the clock signal is transmitted between memories, a CML level transmission manner is usually used to improve signal transmission efficiency. Furthermore, a CMOS level transmission manner is usually used inside the memory for signal transmission. Therefore, after obtaining the second clock signal at the pin, the second converter 25 in the write leveling circuit may convert the second clock signal transmitted in the CML level transmission manner into the first clock signal transmitted in the CMOS level transmission manner, and then transmit the first clock signal to the write signal generation unit 21 connected to the second converter 25, so that each device in the write leveling circuit in the memory may recognize the first clock signal accurately.

In some embodiments, the first sampling signal is configured to instruct to regulate a delay time of the first DQS in response to the first sampling signal characterizing that the effective edge of the first clock signal is not aligned with the effective edge of the first DQS. The second sampling signal is configured to instruct to regulate a delay time of the first write signal or regulate a delay time of the first DQS in response to the first sampling signal characterizing that the effective edge of the first clock signal is aligned with the effective edge of the first DQS and the effective edge of the first DQS is not aligned with the effective edge of the second write signal.

Exemplarily, in the embodiment, in order to implement the external write leveling process of the memory, when the controller outside the memory determines that the first sampling signal characterizes that the effective edge of the first clock signal is not aligned with the effective edge of the first DQS, the controller may continuously regulate the delay time of the DQS transmitted to the memory, that is, continuously adjust the delay time of the first DQS, to enable the effective edge of the first clock signal to be aligned with the effective edge of the first DQS.

Furthermore, in an internal write leveling process, in order to prevent the problem of large power consumption during signal transmission inside the memory, the following manners are used for regulation. In the embodiment, after the external write leveling process is ended, that is, when the first sampling signal characterizes that the effective edge of the first clock signal is aligned with the effective edge of the first DQS, and the second sampling signal characterizes that the effective edge of the first DQS is not aligned with the effective edge of the second write signal, the delay time of the first write signal or the delay time of the first DQS may be regulated, to enable the effective edge of the first DQS to be aligned with the effective edge of the second write signal.

It may be understood that compared to the manner in the external write leveling process where the first DQS is delayed by the delay unit 23 and then outputted, the first DQS is not delayed in the internal write leveling process, thereby reducing the delay of transmitting the first DQS inside the memory. Furthermore, power consumption caused by the first write signal during transmission may also be reduced by regulating the delay time of the first write signal subsequently. Then the delay time of the first write signal or the delay time of the first DQS is continuously regulated for achieving the internal write leveling.

Figure 9:
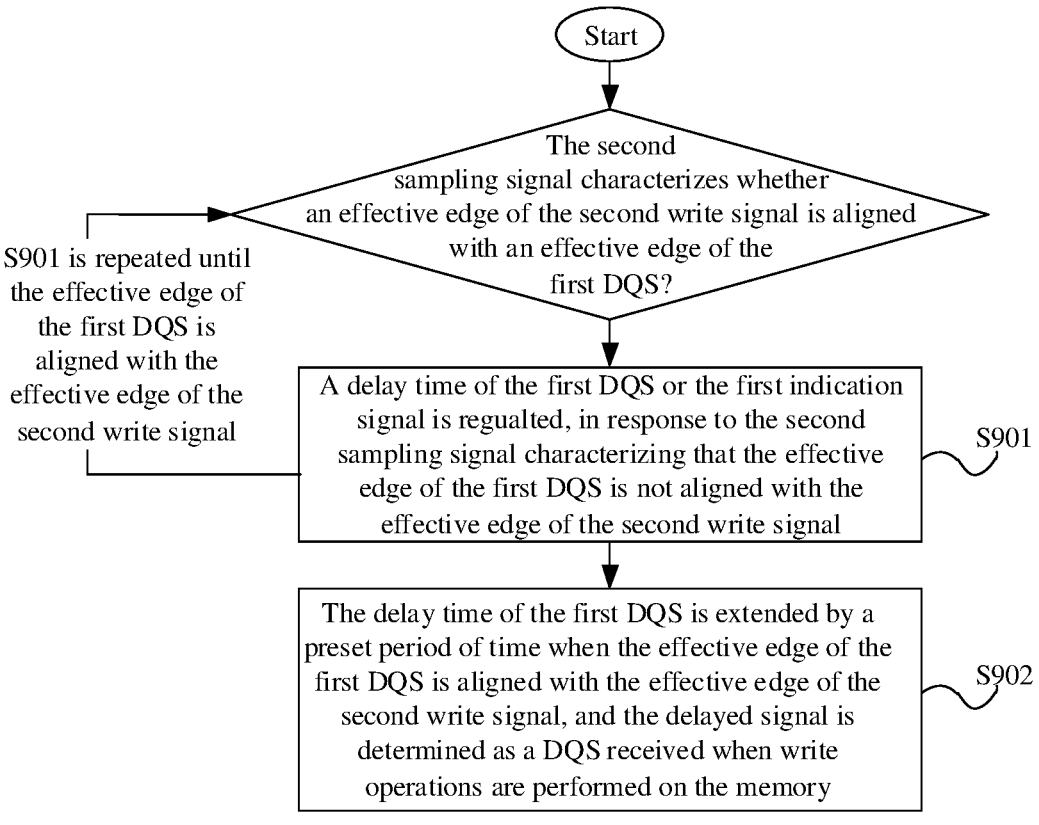
FIG. 9 is a schematic flowchart of a method for controlling a write leveling circuit applied to a memory according to an embodiment of the disclosure.

FIG. 9 is a schematic flowchart of a method for controlling a write leveling circuit applied to a memory according to an embodiment of the disclosure. The method provided in the embodiment is applied to the write leveling circuit shown in FIG. 1, and includes the following operations S901 and S902.

At S901, a delay time of the first DQS or the first indication signal is regulated, in response to the second sampling signal characterizing that an effective edge of the first DQS is not aligned with an effective edge of the second write signal.

S901 is repeated until the second sampling signal outputted by the sampling unit determines that the effective edge of the first DQS is aligned with the effective edge of the second write signal.

Exemplarily, an executive body of the embodiment may be the controller outside the memory or other electronic devices, which is not limited in the disclosure. The following descriptions are made by taking the controller as an example of the executive body of the disclosure.

In the embodiment, after the external write leveling process is ended, the internal write leveling is performed on the memory. When the internal write leveling is performed on the memory, when the controller determines that the effective edge of the first DQS is not aligned with the effective edge of the second write signal based on the second sampling signal, the controller may regulate the first DQS or the first indication signal to ensure that the effective edge of the first DQS is aligned with the effective edge of the second write signal, that is, ensure that the DQS received by storage units inside the memory is aligned with the write signal. Regulation of the first indication signal is equivalent to regulation of the delay time of the second write signal relative to the first write signal.

At S902, the delay time of the first DQS is extended for a preset period of time in response to the effective edge of the first DQS being aligned with the effective edge of the second write signal, and the delayed signal is determined as a DQS received when write operations are performed on the memory.

Exemplarily, in order to further ensure that a time difference between the effective edge of the DQS received at the pin of the memory and the effective edge of the clock signal received at the pin meets specification requirements of the memory, the controller in the embodiment may extend the delay time of the first DQS aligned for a preset period of time when the controller determines that the second sampling signal characterizes that the effective edge of the first DQS is aligned with the effective edge of the second write signal, and take the delayed DQS as the first DQS received when write operations are performed on the memory. Furthermore, a time difference between the effective edge of the first DQS delayed for the preset period of time, and the effective edge of the first clock signal received at the pin of the memory in alignment meets the time difference required by the memory specification (such as tDQS offset of the memory).

It should be noted that the preset period of time in the disclosure may be determined based on a write preamble signal and correspondences between write preamble signals and preset durations.

It may be understood that in the embodiment, in order to reduce power consumption caused during transmission of the DQS and the write signal inside the memory, the controller may continuously regulate the delay time of the first DQS or the delay time of the first write signal in the internal write leveling process based on the received second sampling signal, to complete the write leveling process of the memory and enable data to be written into the memory accurately. Furthermore, the delay time of the first DQS when the effective edge of the first DQS is aligned with the effective edge of the second write signal is extended for the preset period of time. Therefore, the DQS received at the pin end of the memory is determined, to accurately write data into the memory.

In some embodiments, the controller outside the memory determines whether the effective edge of the first DQS is aligned with the effective edge of the second write signal based on the second sampling signal outputted by the sampling unit in the following manners.

It is determined that the effective edge of the first DQS is aligned with the effective edge of the second write signal, in response to a level value of the second sampling signal outputted by the sampling unit changing from a second level value to a first level value.

Exemplarily, in the embodiment, in order to determine whether the effective edge of the first DQS is aligned with the effective edge of the second write signal, the sampling unit, upon receiving the first DQS and the second write signal outputted by the write signal generation unit, may sample the level value of the second write signal at the effective edge of the first DQS, and take the sampling result as the second sampling signal outputted by the sampling unit, and detect variation of the level value of the second sampling signal continuously. When the level value of the second sampling signal is switched from the second level value to the first level value, it characterizes that the effective edge of the second write signal is aligned with the effective edge of the first DQS.

It may be understood that in the embodiment, it may determine whether the effective edge of the first DQS is aligned with the effective edge of the second write signal by detecting whether the level value of the second sampling signal is switched from the second level value to the first level value. The method provided in the embodiment is simple and easy to be implemented, without repeatedly calculating the time difference between the effective edges of the signals multiple times.

Figure 10:
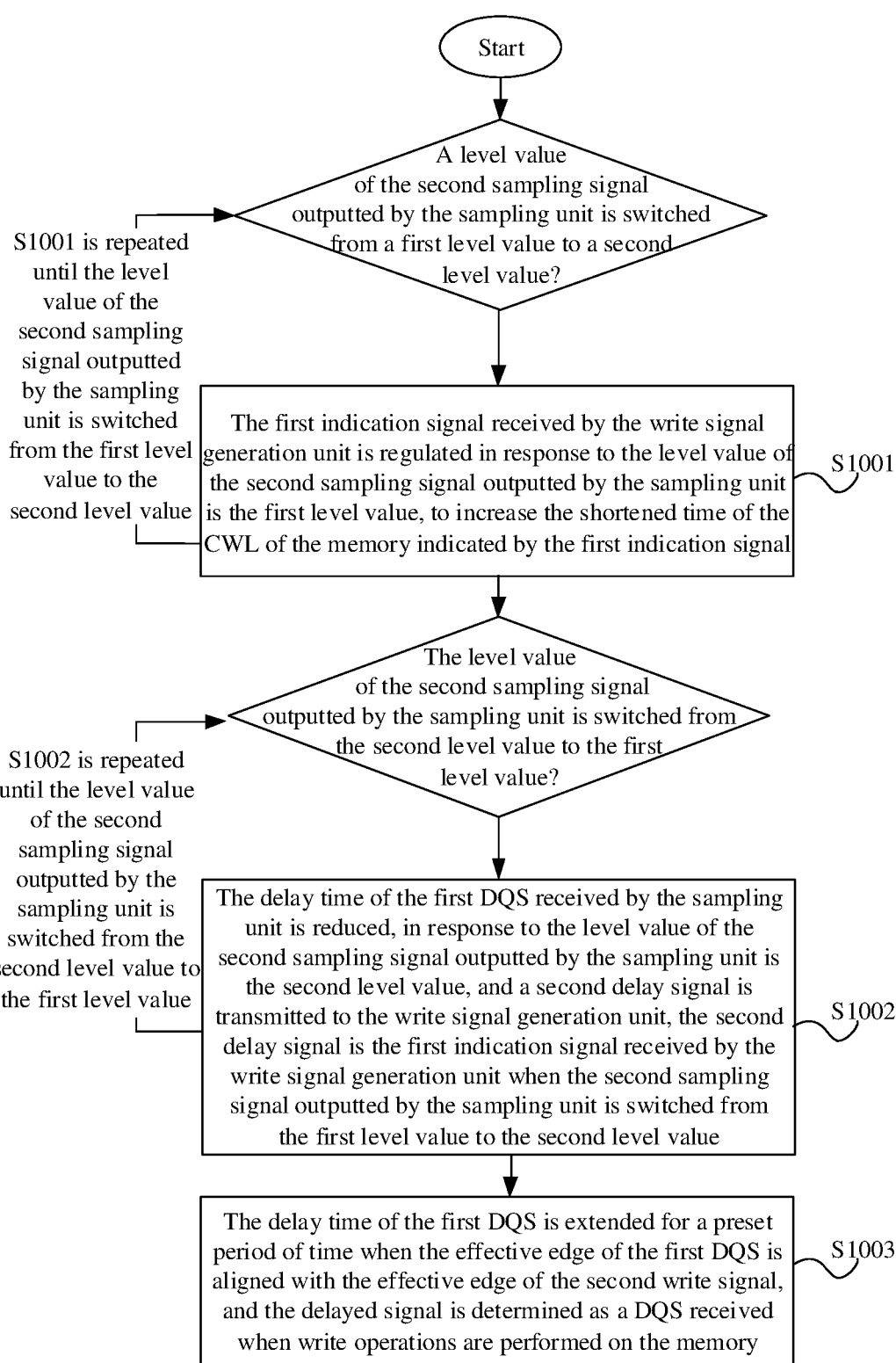
FIG. 10 is a schematic flowchart of another method for controlling a write leveling circuit applied to a memory according to an embodiment of the disclosure.

FIG. 10 is a schematic flowchart of another method for controlling a write leveling circuit applied to a memory according to an embodiment of the disclosure. The method includes the following operations S1001 to S1003.

At S1001, the first indication signal received by the write signal generation unit is regulated in response to a level value of the second sampling signal outputted by the sampling unit being a first level value, to increase the shortened time of the CWL of the memory indicated by the first indication signal, and the regulated first indication signal is transmitted to the write signal generation unit.

S1001 is repeated until the level value of the second sampling signal outputted by the sampling unit is converted from the first level value to a second level value.

Exemplarily, when the internal write leveling is performed on the memory, the controller in the embodiment determines whether the effective edge of the second write signal is aligned with the effective edge of the first DQS, by determining the level value of the second sampling signal outputted by the sampling unit in real-time. Specifically, when the controller determines that the level value of the second sampling signal outputted by the sampling unit is the first level value, the controller may regulate the first indication signal transmitted to the write signal generation unit, to increase the shortened time of the CWL indicated by the first indication signal, that is, correspondingly, it is equivalent to continuously reducing the delay time between the first write signal and the second write signal generated by the write signal generation unit. The time difference between the effective edge of the first DQS and the effective edge of the second write signal is reduced by continuously regulating the delay of the first write signal generated by the write signal generation unit.

It should be noted that due to limitations of specification requirements in the memory, when the shortened time of the CWL indicated by the first indication signal is regulated, the shortened time of the CWL may only be an integer multiple of the time cycle of the first clock signal. Therefore, when the delay time of the first write signal is regulated, a value of the delay time changed each time may only be an integer multiple of the time cycle. When the outputted sampling value of the second sampling signal is switched from the first level value to the second level value, the effective edge of the first DQS may not be aligned with the effective edge of the second write signal, resulting in that the time corresponding to the effective edge of the first DQS is later than the time corresponding to the effective edge of the second write signal. Therefore, the delay time of the first DQS should be regulated.

At S1002, the delay time of the first DQS received by the sampling unit is reduced, in response to the level value of the second sampling signal outputted by the sampling unit being the second level value, and a second delay signal is transmitted to the write signal generation unit. The second delay signal is the first indication signal received by the write signal generation unit when the second sampling signal outputted by the sampling unit is switched from the first level value to the second level value.

S1002 is repeated until the level value of the second sampling signal outputted by the sampling unit is switched from the second level value to the first level value.

Exemplarily, after completing the above regulation in S1001, in order to ensure that the effective edge of the first DQS is aligned with the effective edge of the second write signal, the delay time of the first DQS may also be regulated in this operation. The delay time of the first DQS is not limited by the memory specification, and a variation amount in each regulation of the delay time is not required to be an integer multiple of the clock cycle of the first clock signal. Therefore, the delay time of the first DQS may be continuously regulated in this operation, that is, the delay time of the first DQS may be continuously reduced, so that the effective edge of the first DQS is aligned with the effective edge of the second DQS. Furthermore, each time the regulated first DQS is transmitted to the memory, the second delay signal is also transmitted to the write signal generation unit in the memory. The second delay signal is the first indication signal received by the determination module when the second sampling signal is switched from the first level value to the second level value, that is, the first indication signal received by the determination module at the end of repeated execution of S1001.

At S1003, the delay time of the first DQS is extended for a preset period of time when the effective edge of the first DQS is aligned with the effective edge of the second write signal, and the delayed signal is determined as a DQS received when write operations are performed on the memory.

Exemplarily, regarding specific principles of this operation, reference may be made to S902, and are not be elaborated here.

It may be understood that in the embodiment, during internal regulation of the memory, power consumption of the first write signal during transmission may be reduced by reducing the delay time for which the first write signal is delayed. Then, the delay time of the first DQS is regulated, to achieve alignment of the effective edge of the first DQS with the effective edge of the second write signal, thereby accurately writing data when write operations are performed on the memory, and reducing power consumption during signal transmission inside the memory in the write operations.

Figure 11:
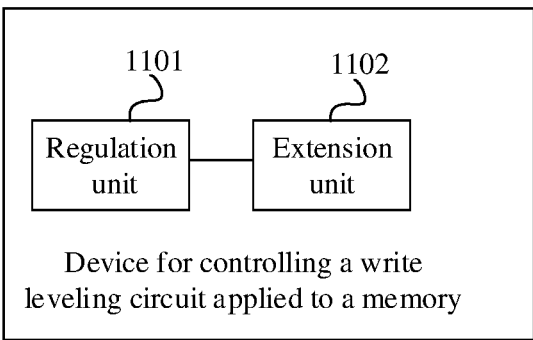
FIG. 11 is a schematic structural diagram of a device for controlling a write leveling circuit applied to a memory according to an embodiment of the disclosure.

FIG. 11 is a schematic structural diagram of a device for controlling a write leveling circuit applied to a memory according to an embodiment of the disclosure. The device includes a regulation unit 1101 and an extension unit 1102.

The regulation unit 1101 is configured to regulate delay of the first DQS or the first indication signal, in response to the second sampling signal characterizes that an effective edge of the first DQS being not aligned with an effective edge of the second write signal, and a first regulation unit is configured to repeat the above operations until the first regulation unit determines that the effective edge of the first DQS is aligned with the effective edge of the second write signal based on the second sampling signal outputted by the sampling unit.

The extension unit 1102 is configured to extend the delay time of the first DQS for a preset period of time when the effective edge of the first DQS is aligned with the effective edge of the second write signal, and determine the delayed signal as a DQS received when write operations are performed on the memory.

The device provided in the embodiment is configured to implement technical solutions provided by the above methods and has similar implementation principle and technical effect as the above method, which are not elaborated.

Figure 12:
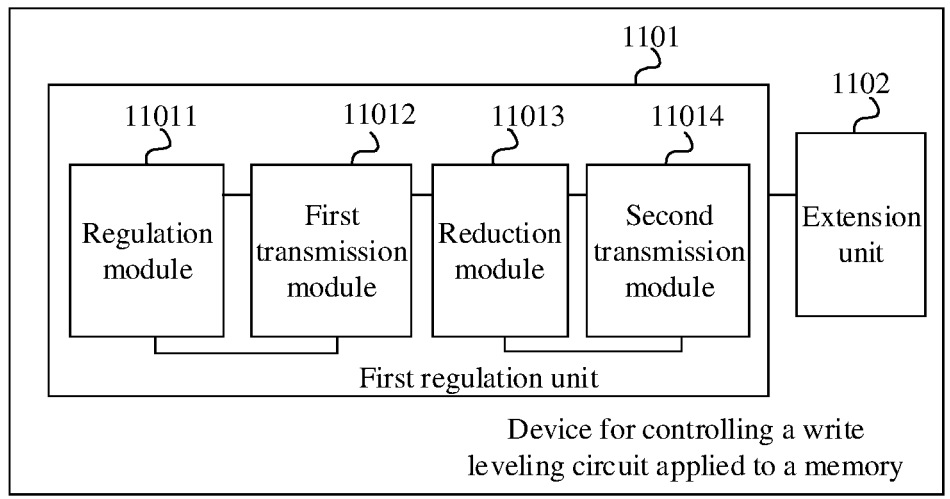
FIG. 12 is a schematic structural diagram of another device for controlling a write leveling circuit applied to a memory according to an embodiment of the disclosure.

FIG. 12 is a schematic structural diagram of another device for controlling a write leveling circuit applied to a memory according to an embodiment of the disclosure. Based on the device shown in FIG. 12, in the embodiment, when the regulation unit 1101 determines that the effective edge of the first DQS is aligned with the effective edge of the second write signal based on the second sampling signal outputted by the sampling unit, the regulation unit 1101 is configured to: determine that the effective edge of the first DQS is aligned with the effective edge of the second write signal, in response to a level value of the second sampling signal outputted by the sampling unit changing from a second level value to a first level value.

In some embodiments, the regulation unit 1101 includes a regulation module 11011, a first transmission module 11012, a reduction module 11013, and a second transmission module 11014.

The regulation module 11011 is configured to regulate the first indication signal received by the write signal generation unit, in response to the level value of the second sampling signal outputted by the sampling unit being the first level value, to increase the shortened time of the CWL of the memory indicated by the first indication signal.

The first transmission module 11012 is configured to transmit the regulated first indication signal to the write signal generation unit.

The operations performed by the regulation module 11011 and the first transmission module 11012 are repeated until the regulation module 11011 determines that the level value of the second sampling signal outputted by the sampling unit is converted from the first level value to the second level value.

The reduction module 11013 is configured to reduce the delay time of the first DQS received by the sampling unit, in response to the level value of the second sampling signal outputted by the sampling unit being the second level value.

The second transmission module 11014 is configured to transmit a second delay signal to the write signal generation unit. The second delay signal is the first indication signal received by the write signal generation unit when the second sampling signal outputted by the sampling unit is switched from the first level value to the second level value. The operations performed by the reduction module 11013 and the transmission module are repeated until the reduction module 11013 determines that the level value of the second sampling signal outputted by the sampling unit is switched from the second level value to the first level value.

The device provided in the embodiment is configured to implement technical solutions provided by the above methods and has similar implementation principle and technical effect, which are not elaborated.

The disclosure provides a memory, including the write leveling circuit provided in any one of the embodiments shown in FIG. 1 to FIG. 8.

The disclosure provides an electronic device, including: a processor; and a memory communicatively connected to the processor and storing computer-executable instructions. The processor executes the computer-executable instructions stored in the memory to implement the method provided in any one of the embodiments shown in FIG. 9 or FIG. 10.

Figure 13:
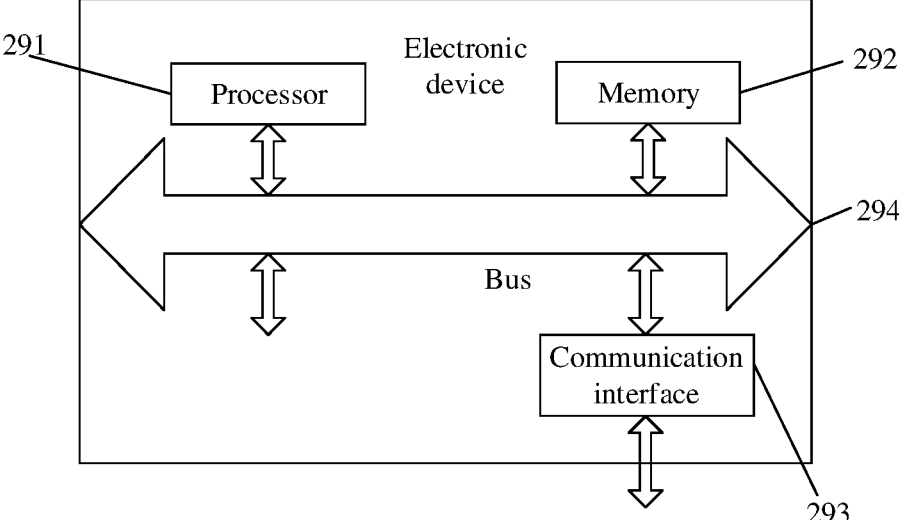
FIG. 13 is a schematic structural diagram of an electronic device according to an embodiment of the disclosure.

FIG. 13 is a schematic structural diagram of an electronic device according to an embodiment of the disclosure. As shown in FIG. 13, the electronic device includes a processor 291. The electronic device further includes a memory 292, and may further include a communication interface 293 and a bus 294. The processor 291, the memory 292 and the communication interface 293 may communicate with each other through the bus 294. The communication interface 293 may be used for information transmission. The processor 291 may call logical instructions in the memory 292 to execute the methods of the above embodiments.

Furthermore, when the above logical instructions in the memory 292 may be implemented in form of software functional units and sold or used as an independent product, the above logical instructions may be stored in a computer-readable storage medium.

As a computer-readable storage medium, the memory 292 may be configured to store software programs, computer-executable programs, such as program instructions/modules corresponding to the methods in the embodiments of the disclosure. The processor 291 executes functional applications and data processing by running the software programs, instructions and modules stored in the memory 292, to implement the methods in the above method embodiments.

The memory 292 may include a program storage area and a data storage area. The program storage area may store an operating system, application programs required for at least one function, and the data storage area may store data created based on usage of terminal devices, or the like. Furthermore, the memory 292 may include a high-speed random access memory, and may also include a non-volatile memory.

The disclosure provides a computer-readable storage medium, having stored thereon computer-executable instructions, the computer-executable instructions are configured to implement the method provided in any one of embodiments shown in FIG. 9 or FIG. 10 when the computer-executable instructions are executed by a processor.

The disclosure provides a computer program product, including a computer program, the computer program implements the method provided in any one of the embodiments shown in FIG. 9 or FIG. 10 when the computer program is executed by a processor.

After considering the descriptions and practicing the disclosure disclosed here, those skilled in the art will easily conceive of other embodiments of the disclosure. The disclosure is intended to cover any variants, usages or adaptive variations of the disclosure, and these variants, usages or adaptive variations conform to general principles of the disclosure and include common knowledge or commonly used technical means in the technical field which are not disclosed in the disclosure. The descriptions and embodiments are only considered as exemplary, and the true scope and spirit of the disclosure are indicated by the attached claims.

It should be understood that the disclosure is not limited to the precise structure as described above and shown in the drawings, and various modifications and variations may be made without departing from the scope thereof. The scope of the disclosure is limited by the attached claims only.

The invention claimed is:

1. A write leveling circuit applied to a memory, comprising:

a write signal generation unit configured to receive a first clock signal and a first indication signal, and delay a first write signal according to the first clock signal, the first indication signal and a specified bit in the first indication signal, and output a second write signal, wherein the first indication signal indicates a shortened time of a Column Address Strobe Write Latency (CWL) of the memory and comprises the specified bit, and a character in the specified bit indicates that the shortened time is an odd multiple of a clock cycle of the first clock signal or an even multiple of the clock cycle of the first clock signal; and a sampling unit which is connected to the write signal generation unit and configured to receive a first Data Strobe Signal (DQS) and the second write signal, and output a second sampling signal according to the first DQS and the second write signal;

wherein the first indication signal comprises at least one binary character, the specified bit is a lowest bit of the first indication signal, and the write signal generation unit comprises:

a preprocessing module configured to sum the first indication signal and the character in the specified bit of the first indication signal, to obtain a preprocessed signal; and a determination module which is connected to the preprocessing module, and configured to delay the first write signal based on the first clock signal, the preprocessed signal, a second indication signal and the specified bit of the first indication signal, and output the second write signal, wherein the second indication signal indicates the CWL of the memory.

2. The write leveling circuit of claim 1, wherein the determination module comprises:

a processing submodule which is connected to the preprocessing module, and configured to determine a third indication signal based on the preprocessed signal and the second indication signal, wherein the third indication signal indicates a delay time required for the first write signal;

a shift register configured to delay the first write signal based on the third indication signal and the first clock signal, to obtain a third write signal; and a compensator which is connected to the shift register, and configured to compensate for a delay time of the third write signal based on the specified bit of the first indication signal and the first clock signal, to obtain the second write signal.

3. The write leveling circuit of claim 2, wherein the processing submodule is configured to:

determine, based on the preprocessed signal and the first mapping relationship, the shortened time of the CWL of the memory corresponding to the first indication signal in a first mapping relationship which is the same as the preprocessed signal as a first delay time corresponding to the preprocessed signal, wherein the first delay time characterizes a shortened time required for the CWL of the memory, and the first mapping relationship is indicates a plurality of first indication signals of the memory and shortened times of the CWL of the memory having one-to-one correspondences to the first indication signals;

determine, based on the second indication signal and a second mapping relationship, a CWL corresponding to the second indication signal, wherein the second mapping relationship indicates a plurality of second indication signals of the memory and CWLs having one-to-one correspondences to the second indication signals; and calculate a difference between the first delay time corresponding to the preprocessed signal and the CWL corresponding to the second indication signal, to obtain a second delay time, and determine an indication signal corresponding to the second delay time as the third indication signal based on the second delay time and the second mapping relationship.

4. The write leveling circuit of claim 2, wherein the compensator is configured to:

take the third write signal as the second write signal in response to the character of the specified bit of the first indication signal characterizing that the shortened time is the even multiple of the clock cycle of the first clock signal; and delay the third write signal to obtain the second write signal in response to the character in the specified bit of the first indication signal characterizing that the shortened time is the odd multiple of the clock cycle of the first clock signal, wherein a duration of the delay is a difference between the first delay time corresponding to the preprocessed signal and the shortened time of the CWL of the memory indicated by the first indication signal.

5. The write leveling circuit of claim 3, wherein the compensator is configured to:

take the third write signal as the second write signal in response to the character of the specified bit of the first indication signal characterizing that the shortened time is the even multiple of the clock cycle of the first clock signal; and delay the third write signal to obtain the second write signal in response to the character in the specified bit of the first indication signal characterizing that the shortened time is the odd multiple of the clock cycle of the first clock signal, wherein a duration of the delay is a difference between the first delay time corresponding to the preprocessed signal and the shortened time of the CWL of the memory indicated by the first indication signal.

6. The write leveling circuit of claim 4, wherein the compensator comprises:

a delayer which is connected to the shift register, and configured to delay the third write signal outputted by the shift register, to obtain a delayed third write signal; and a first data selector connected to the delayer and the shift register, and configured to receive the delayed third write signal outputted by the delayer and the third write signal outputted by the shift register, receive the specified bit of the first indication signal, and output the third write signal as the second write signal in response to the character in the specified bit of the first indication signal characterizing the even multiple of the clock cycle of the first clock signal, and output the delayed third write signal as the second write signal in response to the character in the specified bit of the first indication signal characterizing the odd multiple of the clock cycle of the first clock signal.

7. The write leveling circuit of claim 1, wherein the write signal generation unit further comprises:

a decoder which is connected to the determination module, and configured to decode received write instructions, and output the first write signal.

8. The write leveling circuit of claim 7, wherein the write signal generation unit further comprises a signal conversion module through which the decoder is connected to the write signal generation unit, the signal conversion module is configured to perform pulse broadening on the first write signal outputted by the decoder, output a broadened write signal, and output the broadened write signal as the first write signal to the determination module.

9. The write leveling circuit of claim 1, wherein the second sampling signal characterizes whether an effective edge of the first DQS is aligned with an effective edge of the second write signal.

10. The write leveling circuit of claim 1, wherein the sampling unit comprises:

a second trigger having a data end which is connected to the write signal generation unit and configured to receive the second write signal output by the write signal generation unit, and a clock end configured to receive the first DQS, wherein the second trigger is configured to output the second sampling signal based on the second write signal and the first DQS.

11. The write leveling circuit of claim 1, further comprising:

a delay unit configured to delay the received first DQS and output a second DQS;

wherein the sampling unit is connected to the delay unit, and configured to receive the second DQS outputted by the delay unit and output a first sampling signal according to the second DQS and the second write signal, the first sampling signal characterizing whether an effective edge of the first clock signal is aligned with an effective edge of the first DQS.

12. The write leveling circuit of claim 11, wherein the sampling unit comprises:

a first trigger having a data end which is connected to the write signal generation unit and configured to receive the second write signal outputted by the write signal generation unit, and a clock end which is connected to an output end of the delay unit and configured to receive the second DQS outputted by the delay unit, wherein the first trigger is configured to output the first sampling signal based on the second write signal and the second DQS;

a second trigger having a data end which is connected to the write signal generation unit and configured to receive the second write signal outputted by the write signal generation unit, and a clock end which is configured to receive the first DQS, wherein the second trigger is configured to output the second sampling signal based on the second write signal and the first DQS; and a second data selector having a first end connected to an output end of the first trigger and a second end connected to an output end of the second trigger.

13. The write leveling circuit of claim 11, further comprising:

a first converter which is connected to the delay unit and the sampling unit, and configured to perform logical level conversion on a received third DQS, to obtain the first DQS, wherein a level of the third DQS is a Current Model Logic (CML) level, and a level of the first DQS is a Complementary Metal Oxide Semiconductor (CMOS) level.

14. The write leveling circuit of claim 11, further comprising:

a second converter which is connected to the write signal generation unit, and configured to perform logical level conversion on a received second clock signal to obtain the first clock signal, wherein a level of the second clock signal is a Current Model Logic (CML) level, and a level of the first clock signal is a Complementary Metal Oxide Semiconductor (CMOS) level.

15. A write leveling circuit applied to a memory, comprising:

a write signal generation unit configured to receive a first clock signal and a first indication signal, and delay a first write signal according to the first clock signal, the first indication signal and a specified bit in the first indication signal, and output a second write signal, wherein the first indication signal indicates a shortened time of a Column Address Strobe Write Latency (CWL) of the memory and comprises the specified bit, and a character in the specified bit indicates that the shortened time is an odd multiple of a clock cycle of the first clock signal or an even multiple of the clock cycle of the first clock signal;

a sampling unit which is connected to the write signal generation unit and configured to receive a first Data Strobe Signal (DQS) and the second write signal, and output a second sampling signal according to the first DQS and the second write signal; and a delay unit configured to delay the received first DQS and output a second DQS;

wherein the sampling unit is connected to the delay unit, and configured to receive the second DQS outputted by the delay unit and output a first sampling signal according to the second DQS and the second write signal, the first sampling signal characterizing whether an effective edge of the first clock signal is aligned with an effective edge of the first DQS;

wherein the first sampling signal is configured to instruct to regulate a delay time of the first DQS in response to the first sampling signal characterizing that the effective edge of the first clock signal is not aligned with the effective edge of the first DQS, and the second sampling signal is configured to instruct to regulate a delay time of the first write signal or the delay time of the first DQS in response to the first sampling signal characterizing that the effective edge of the first clock signal is aligned with the effective edge of the first DQS, and the effective edge of the first DQS is not aligned with the effective edge of the second write signal.

16. A method for controlling a write leveling circuit applied to a memory, wherein the method is applied to the circuit of claim 1, comprising:

repeating following operations until it is determined based on the second sampling signal outputted by the sampling unit that an effective edge of the first DQS is aligned with an effective edge of the second write signal: regulating a delay time of the first DQS or the first indication signal in response to the second sampling signal characterizing that the effective edge of the first DQS is not aligned with the effective edge of the second write signal; and extending the delay time of the first DQS for a preset period of time in response to the effective edge of the first DQS being aligned with the effective edge of the second write signal, and determining the delayed signal as a DQS received when write operations are performed on the memory.

17. The method of claim 16, wherein it being determined based on the second sampling signal outputted by the sampling unit that the effective edge of the first DQS is aligned with the effective edge of the second write signal comprises:

determining that the effective edge of the first DQS is aligned with the effective edge of the second write signal in response to a level value of the second sampling signal outputted by the sampling unit changing from a second level value to a first level value.

18. The method of claim 17, wherein the repeating following operations until it is determined based on the second sampling signal outputted by the sampling unit that an effective edge of the first DQS is aligned with an effective edge of the second write signal: regulating a delay time of the first DQS or the first indication signal in response to the second sampling signal characterizing that the effective edge of the first DQS is not aligned with the effective edge of the second write signal comprises:

repeating following operations until the level value of the second sampling signal outputted by the sampling unit is converted from the first level value to the second level value: regulating the first indication signal received by the write signal generation unit, in response to the level value of the second sampling signal outputted by the sampling unit being the first level value, to increase the shortened time of the CWL of the memory indicated by the first indication signal, and transmitting the regulated first indication signal to the write signal generation unit; and repeating following operations until the level value of the second sampling signal outputted by the sampling unit is switched from the second level value to the first level value: reducing the delay time of the first DQS received by the sampling unit in response to the level value of the second sampling signal outputted by the sampling unit being the second level value, and transmitting a second delay signal to the write signal generation unit, wherein the second delay signal is the first indication signal received by the write signal generation unit when the second sampling signal outputted by the sampling unit is switched from the first level value to the second level value.

19. A memory comprising a write leveling circuit, wherein the write leveling circuit comprises:

a write signal generation unit configured to receive a first clock signal and a first indication signal, and delay a first write signal according to the first clock signal, the first indication signal and a specified bit in the first indication signal, and output a second write signal, wherein the first indication signal indicates a shortened time of a Column Address Strobe Write Latency (CWL) of the memory and comprises the specified bit, and a character in the specified bit indicates that the shortened time is an odd multiple of a clock cycle of the first clock signal or an even multiple of the clock cycle of the first clock signal; and a sampling unit which is connected to the write signal generation unit and configured to receive a first Data Strobe Signal (DQS) and the second write signal, and output a second sampling signal according to the first DQS and the second write signal;

wherein the first indication signal comprises at least one binary character, the specified bit is a lowest bit of the first indication signal, and the write signal generation unit comprises:

a preprocessing module configured to sum the first indication signal and the character in the specified bit of the first indication signal, to obtain a preprocessed signal; and a determination module which is connected to the preprocessing module, and configured to delay the first write signal based on the first clock signal, the preprocessed signal, a second indication signal and the specified bit of the first indication signal, and output the second write signal, wherein the second indication signal indicates the CWL of the memory.

* * * * *